(12) United States Patent
Shuto

(10) Patent No.: US 8,861,251 B2
(45) Date of Patent: Oct. 14, 2014

(54) SEMICONDUCTOR STORAGE DEVICE

(75) Inventor: Susumu Shuto, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 192 days.

(21) Appl. No.: 13/423,936

(22) Filed: Mar. 19, 2012

(65) Prior Publication Data
US 2012/0314469 A1 Dec. 13, 2012

(30) Foreign Application Priority Data
Jun. 8, 2011 (JP) ................................. 2011-128442

(51) Int. Cl.
*G11C 11/06* (2006.01)
*G11C 11/16* (2006.01)
*H01L 27/22* (2006.01)

(52) U.S. Cl.
CPC ............. *G11C 11/161* (2013.01); *G11C 11/16* (2013.01); *G11C 11/06035* (2013.01); *H01L 27/228* (2013.01)
USPC .......... 365/130; 365/171; 365/209; 365/225.5

(58) Field of Classification Search
CPC .............. G11C 11/06035; G11C 11/16; G11C 11/06042; G11C 11/06078; G11C 11/15
USPC ................ 365/130, 171, 209, 225.5
See application file for complete search history.

(56) References Cited

U.S. PATENT DOCUMENTS

| | | | |
|---|---|---|---|
| 7,457,150 B2 | 11/2008 | Tsuchida et al. | |
| 2008/0203503 A1 | 8/2008 | Asao | |
| 2008/0308887 A1* | 12/2008 | Asao et al. | 257/421 |

FOREIGN PATENT DOCUMENTS

| | | |
|---|---|---|
| JP | 2007-317795 | 12/2007 |
| JP | 2008-192636 | 8/2008 |

OTHER PUBLICATIONS

Tsuchida, et al. "A 64Mb MRAM with Clamped-Reference and Adequate-Reference Schemes", ISSCC 2010 IEEE/ Session 14/ Non-Volatile Memory / 14.2, pp. 258-260.

* cited by examiner

*Primary Examiner* — Jason Lappas
(74) *Attorney, Agent, or Firm* — Knobbe, Martens, Olson & Bear LLP

(57) ABSTRACT

A semiconductor storage device includes a semiconductor substrate and an active area on the semiconductor substrate. A plurality of cell transistors are formed on the active area. A first bit line and a second bit line are paired with each other. A plurality of word lines intersect the first and second bit lines. A plurality of storage elements respectively has a first end electrically connected to a source or a drain of one of the cell transistors and a second end connected to the first or second bit line. Both of the first and second bit lines are connected to the same active area via the storage elements.

17 Claims, 9 Drawing Sheets

| SELECTED MTJ0 | PASS MTJ1 | PASS MTJ2 | Rtotal |
|---|---|---|---|
| 7KΩ | 7KΩ | 7KΩ | 10.5KΩ |
| 7KΩ | 7KΩ | 21KΩ | 12.25KΩ |
| 7KΩ | 21KΩ | 7KΩ | 12.25KΩ |
| 7KΩ | 21KΩ | 21KΩ | 17.5KΩ |
| 21KΩ | 7KΩ | 7KΩ | 24.5KΩ |
| 21KΩ | 7KΩ | 21KΩ | 26.25KΩ |
| 21KΩ | 21KΩ | 7KΩ | 26.25KΩ |
| 21KΩ | 21KΩ | 21KΩ | 31.5KΩ |

…

SEMICONDUCTOR STORAGE DEVICE

CROSS REFERENCE TO RELATED APPLICATIONS

This application is based upon and claims the benefit of priority from the prior Japanese Patent Application No. 2011-128442, filed on Jun. 8, 2011; the entire contents of which are incorporated herein by reference.

FIELD

The embodiments of the present invention relate to a semiconductor device.

BACKGROUND

A magnetic random access memory (MRAM) is a type of a resistance change memories. As techniques for writing data to an MRAM, there have been known magnetic field writing and spin-transfer torque writing. Among these techniques, the spin-transfer torque writing has advantages in higher integration, lower power consumption, and higher performance because of the property of a spin-transfer torque device that a spin injection current is smaller in an amount necessary for magnetization reversal as magnetic bodies become smaller in size.

A magnetic tunnel junction (MTJ) element of the spin-transfer torque has a stacked structure in which a nonmagnetic layer (an insulation film) is sandwiched between two ferromagnetic layers. The MTJ element stores therein digital data by a change in a magnetic resistance due to the spin-polarized tunneling. The MTJ element can be set in a low resistance state or a high resistance state in proportion to magnetization orientations of the two ferromagnetic layers. When the magnetization orientations of the two ferromagnetic layers are in a P (Parallel) state, the MTJ element is in the low resistance state, and when the magnetization orientations of the two ferromagnetic layers are in an AP (Anti Parallel) state, the MTJ element is in the high resistance state.

When writing data corresponding to the P state, it is necessary to supply a current necessary to reverse the state of the MTJ element from the AP state to the P state. When writing the AP state, it is necessary to supply a current necessary to reverse the state of the MTJ element from the P state to the AP state.

Conventionally, in an MRAM, two cell transistors are provided per one MTJ element so as to supply a sufficiently high write current to an MTJ element. One of a source and a drain of each cell transistor is connected to a lower end of the MTJ element, and the other one of the source and the drain is connected to a bit line via a via contact. Therefore, the layout area of a memory cell in the MRAM increases by as much as two via contacts corresponding to the two cell transistors. The memory cell size of the conventional MRAM is $16F^2$ (where F is a Feature Size).

DETAILED DESCRIPTION

A semiconductor storage device according to the present embodiment comprises a semiconductor substrate and an active area on the semiconductor substrate. A plurality of cell transistors are formed on the active area. A first bit line and a second bit line are paired with each other. A plurality of word lines intersect the first and second bit lines. A plurality of storage elements respectively has a first end electrically connected to a source or a drain of one of the cell transistors and a second end connected to the first or second bit line. Both of the first and second bit lines are connected to the same active area via the storage elements.

Embodiments will now be explained with reference to the accompanying drawings. The present invention is not limited to the embodiments.

First Embodiment

Figure 1:
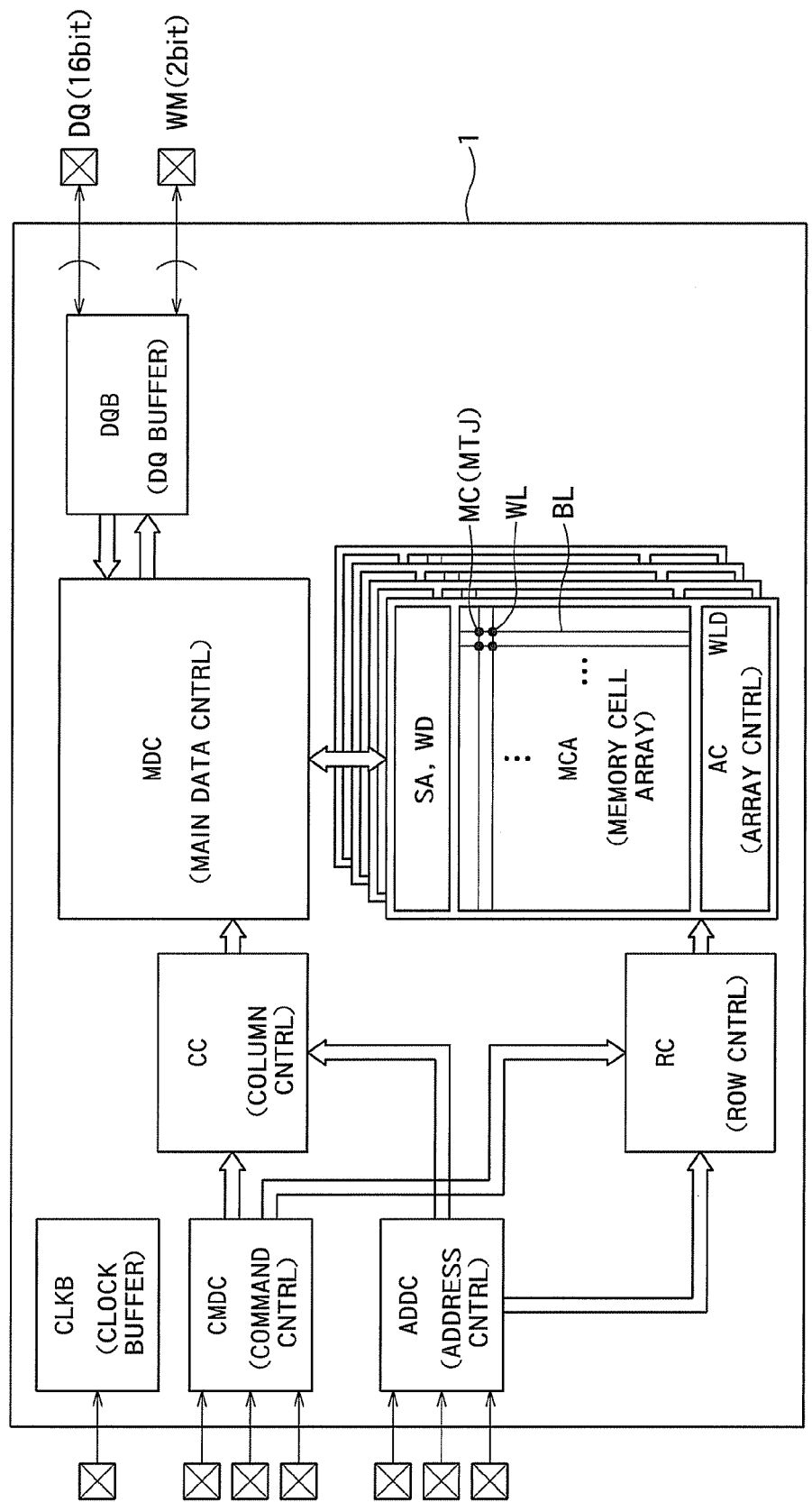
FIG. 1 is a block diagram showing a memory chip 1 of a magnetic random access memory according to a first embodiment.

FIG. 1 is a block diagram showing a memory chip 1 of a magnetic random access memory (hereinafter, "MRAM") according to a first embodiment. The first embodiment is also applicable to memories (a PCRAM and an RRAM, for example) using resistance change elements other than the MRAM.

The MRAM according to the first embodiment includes memory cell arrays MCA, sense amplifiers SA, write drivers WD, a main data controller MDC, a DQ buffer DQB, a column controller CC, a row controller RC, a clock buffer CLKB, a command controller CMDC, an address controller ADDC, array controllers AC, and word line drivers WLD.

Each of the memory cell arrays MCA includes a plurality of memory cells MC arranged two-dimensionally in a matrix. The memory cells MC are arranged to correspond to intersections between bit lines BL (or pairs of bit lines BL) and word lines WL, respectively. The bit lines BL extend in a column direction. The word lines WL extend in a row direction orthogonal to the column direction.

Each of the sense amplifiers SA is connected to the memory cells MC via the corresponding bit line BL, and configured to detect data stored in the memory cells MC. Each of the write drivers WD is connected to the memory cells MC via the corresponding bit line BL, and configured to write data to the memory cells MC.

The main data controller MDC transfers data received from the DQ buffer DQB to one of the write drivers WD so as to write data to the memory cells MC in a desired column under control of the column controller CC, or transfers data read from the memory cells MC in the desired column to the DQ buffer DQB under control of the column controller CC. Furthermore, the main data controller MDC is configured to inhibit data writing in response to write mask data WM or a write inhibit area address WOADD, as described later.

The DQ buffer DQB temporarily holds read data via a DQ pad DQ and outputs the read data to outside of the memory chip 1. Alternatively, the DQ buffer DQB receives write data via the DQ pad DQ from outside of the memory chip 1 and temporarily holds the write data.

The column controller CC controls one of the sense amplifiers SA or one of the write drivers WD to operate so that the sense amplifier SA or write driver WD selectively drives one bit line BL in the desired column in response to a column address.

The row controller RC controls one of the word line drivers WLD to operate so that the word line driver WLD selectively drives a desired word line WL in response to a row address.

A clock-signal-determining operation timing of the entire memory chip 1 is input to the clock buffer CLKB.

The command controller CMDC receives commands indicating various operations such as a data reading operation and a data writing operation, and controls the column controller CC and the row controller RC in response to those commands.

The address controller ADDC receives the row address and the column address, decodes these addresses, and transmits the decoded row and column addresses to the column controller CC and the row controller RC, respectively.

Each of the array controllers AC controls entirety of the corresponding memory cell array MCA.

Figure 2:
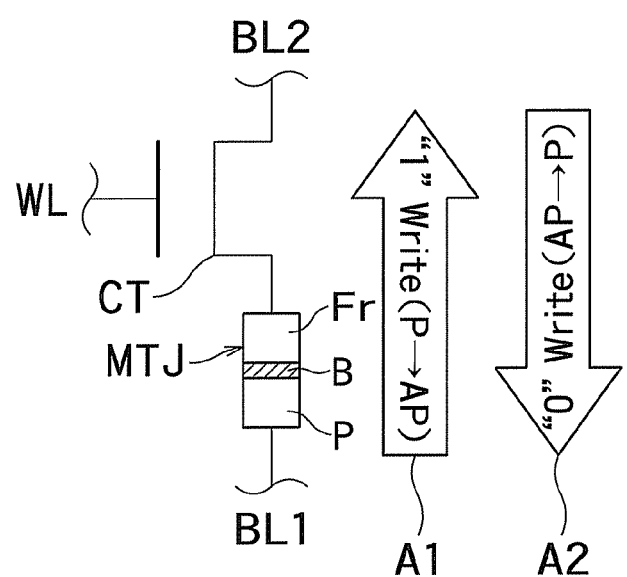
FIG. 2 is an explanatory diagram showing a configuration of a single memory cell MC.

FIG. 2 is an explanatory diagram showing a configuration of a single memory cell MC. Each memory cell MC includes a magnetic tunnel junction (MTJ) element and a cell transistor CT. The MTJ element and the cell transistor CT are connected in series between one bit line BL and a source line SL. In the memory cell MC, the cell transistor CT is arranged near the bit line BL and the MTJ element is arranged near the source line SL. A gate of the cell transistor CT is connected to one word line WL.

The MTJ element that uses the TMR (tunneling magnetoresistive) effect has a stacked structure in which a nonmagnetic layer (tunnel dielectric film) is sandwiched between two ferromagnetic layers. The MTJ element stores therein digital data by a change in a magnetic resistance due to the spin-polarized tunneling. The MTJ element can be set in a low resistance state or a high resistance state depending on magnetization orientations of the two ferromagnetic layers. For example, when it is defined that the low resistance state indicates data "0" and that the high resistance state indicates data "1", one-bit data can be recorded in the MTJ element. Needless to say, it can be defined that the low resistance state indicates data "1" and that the high resistance state indicates data "0". For example, the MTJ element is configured to sequentially stack a pinned layer P, a tunnel barrier layer B, and a recording layer Fr. The pinned layer P and the recording layer Fr are made of a ferromagnetic body and the tunnel barrier layer B is an insulating film. The pinned layer P has a fixed magnetization orientation, and the recording layer Fr has a variable magnetization orientation. The MTJ element stores data depending on the magnetization orientation of the recording layer Fr.

During the data writing operation, when a current equal to or higher than an inversion threshold current flows to the MTJ element in an arrow A1 direction, the magnetization orientation of the recording layer Fr becomes anti-parallel to that of the pinned layer P. The MTJ element thereby turns into the high resistance state (data "1"). During the data writing operation, when the current equal to or higher than the inversion threshold current flows to the MTJ element in an arrow A2 direction, the magnetization orientation of the recording layer Fr becomes parallel to that of the pinned layer P. The MTJ element thereby turns into the low resistance state (data "0"). In this way, different data can be written to the MTJ element depending on a current flow direction.

Figure 3:
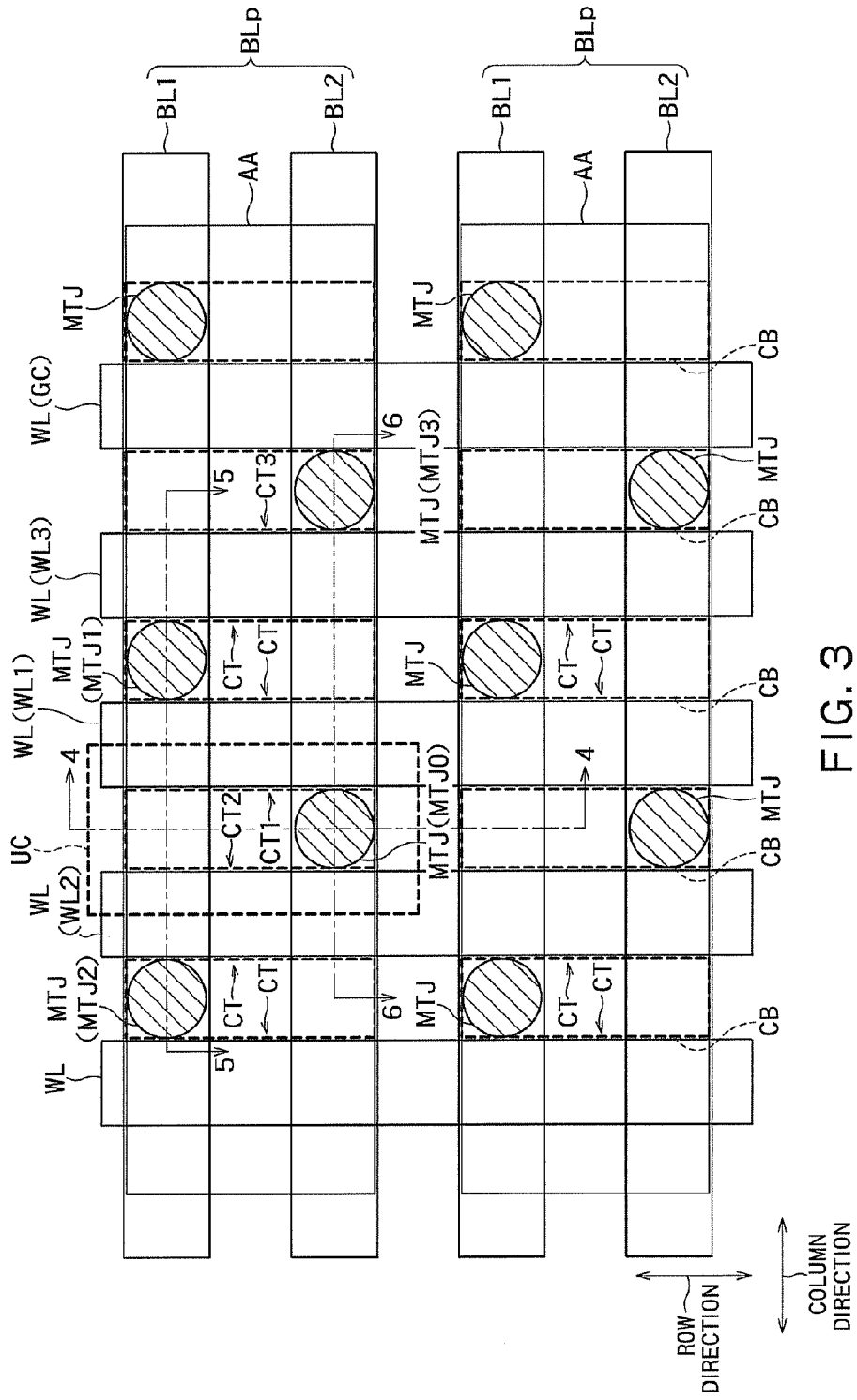
FIG. 3 is a partial plan layout view of each of the memory cell arrays MCA in the MRAM according to the first embodiment.
Figure 4:
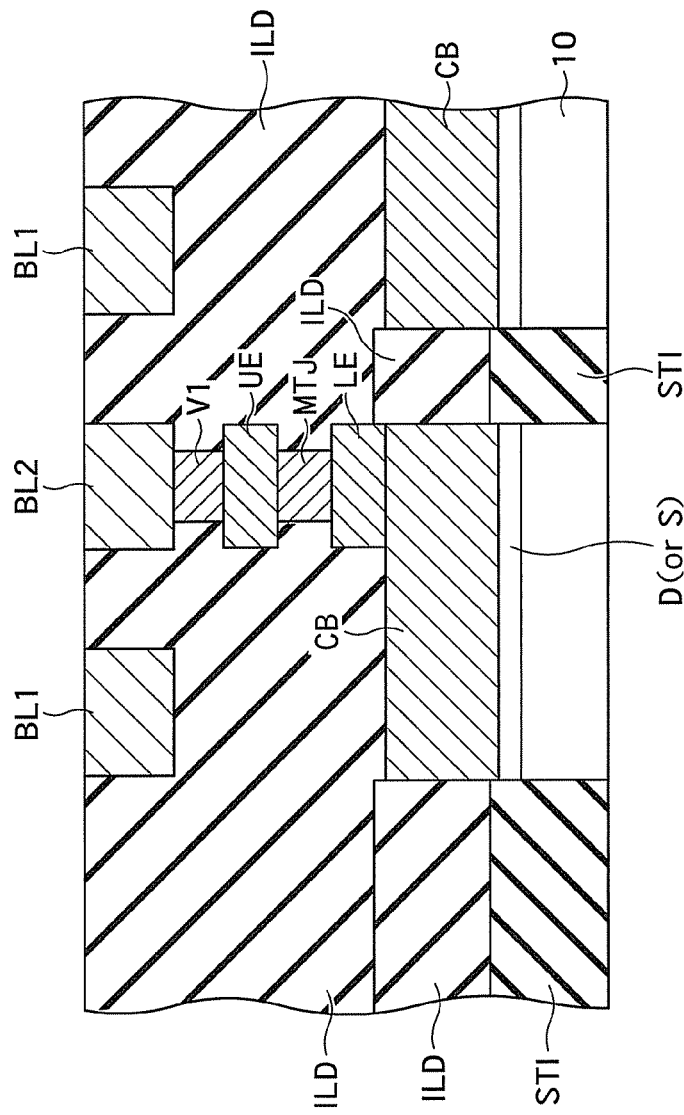
FIG. 4 is a cross-sectional view taken along a line 4-4 of FIG. 3.
Figure 5:
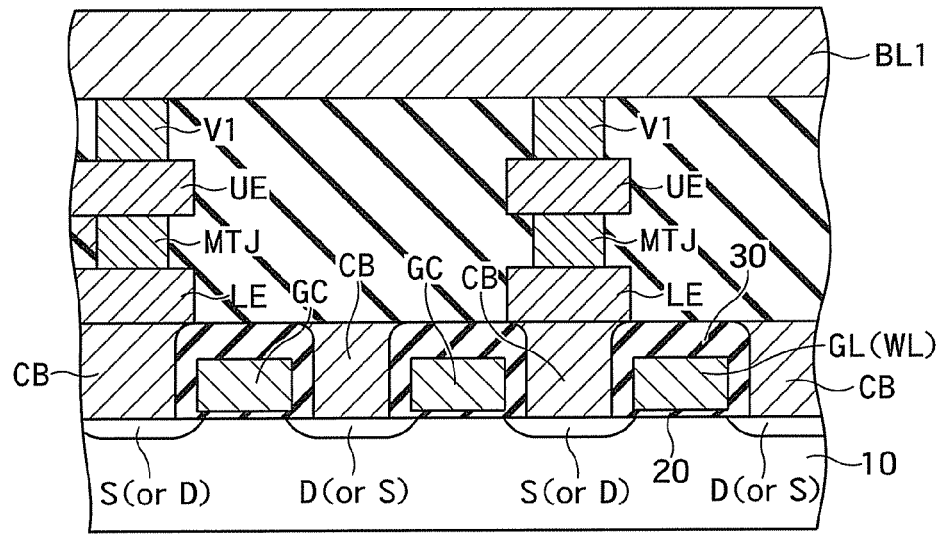
FIG. 5 is a cross-sectional view taken along a line 5-5 of FIG. 3.
Figure 6:
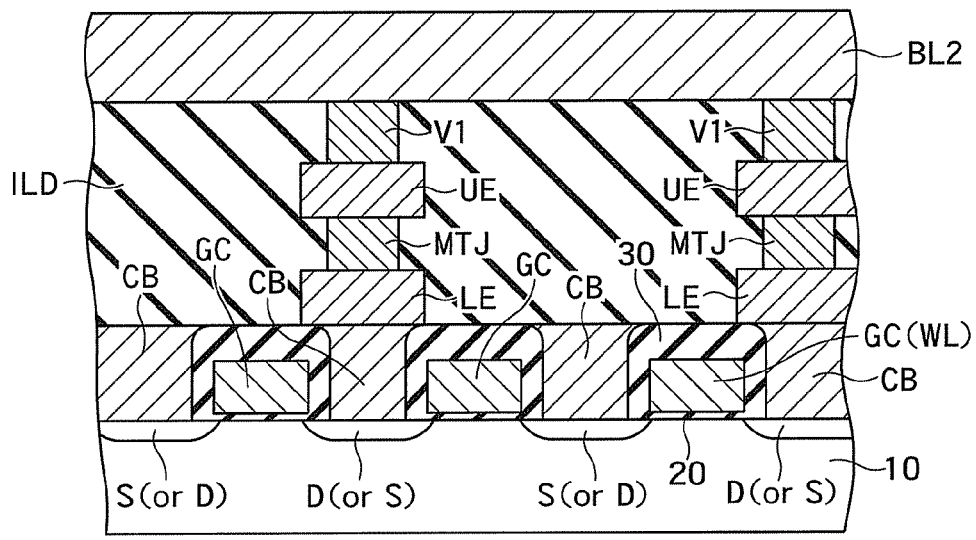
FIG. 6 is a cross-sectional view taken along a line 6-6 of FIG. 3.

FIG. 3 is a partial plan layout view of each of the memory cell arrays MCA in the MRAM according to the first embodiment. FIG. 4 is a cross-sectional view taken along a line 4-4 of FIG. 3. FIG. 5 is a cross-sectional view taken along a line 5-5 of FIG. 3. FIG. 6 is a cross-sectional view taken along a line 6-6 of FIG. 3.

As shown in FIG. 3, in the MRAM according to the first embodiment, first bit lines BL1 and second bit lines BL2 extend in the column direction, and the word lines WL extend in the row direction substantially orthogonal to the column direction. One first bit line BL1 and one second bit line BL2 constitute a pair of bit lines (hereinafter, "bit line pair") BLp. Each bit line pair BLp corresponds to an active area AA. The first and second bit lines BL1 and BL2 of the bit line pair BLp are electrically connected to upper ends of the MTJ elements provided on the same active area AA. Lower ends of the MTJ elements are electrically connected to a source or a drain of the cell transistors CT.

In a plan layout, the MTJ elements are provided between the two adjacent word lines WL. The MTJ elements provided between the two adjacent word lines WL share the two word lines WL. The two word lines WL function as gate electrodes GC of the cell transistors CT, and make conductive the cell transistors CT corresponding to a selected MTJ element when the MTJ element is selected from the MTJ elements provided between the two word lines WL.

The active area AA continuously extends in the column direction in the memory cell array MCA. Therefore, the MTJ elements arranged in the column direction to correspond to one bit line pair BLp share the active area AA. The active area AA is separated into a plurality of areas by element isolation regions STI (Shallow Trench Isolation) in the row direction.

As shown in FIGS. 5 and 6, the MRAM according to the first embodiment includes a silicon substrate 10 serving as a semiconductor substrate and the active areas AA formed on the silicon substrate 10. Each of the cell transistors CT formed on the active areas AA includes a source layer S, a drain layer D, and the gate electrode GC. The gate electrode GC is isolated from the silicon substrate 10 by a gate dielectric film 20, and isolated from a contact plug CB by an insulating film 30.

As shown in FIG. 5, in a cross-section along the first bit line BL1, a contact plug CB is provided on the source layer S of each cell transistor CT. A lower electrode LE is provided on the contact plug CB, and one MTJ element is provided on the lower electrode LE. The source layer S of the cell transistor CT is thereby electrically connected to the lower end of the MTJ element serving as a first storage element via the contact plug CB and the lower electrode LE. Further, an upper electrode UE is provided on the MTJ element, and the via contact V1 is provided on the upper electrode UE. The first bit line BL1 is provided on the via contact V1. The upper end of the MTJ element serving as the first storage element is thereby connected to the first bit line BL1 via the upper electrode UE and the via contact V1.

As shown in FIG. 6, in a cross-section along the second bit line BL2, the contact plug CB is provided on the drain layer D of each cell transistor CT. The lower electrode LE is provided on the contact plug CB, and one MTJ element is provided on the lower electrode LE. The drain layer D of the cell transistor CT is thereby electrically connected to the lower end of the MTJ element serving as a second storage element via the contact plug CB and the lower electrode LE. Further, the upper electrode UE is provided on the MTJ element, and the via contact V1 is provided on the upper electrode UE. The second bit line BL2 is provided on the via contact V1. The upper end of the MTJ element serving as the second storage element is thereby connected to the second bit line BL1 via the upper electrode UE and the via contact V1.

That is, as shown in FIG. 5, the first bit line BL1 is electrically connected to the source layer S of each cell transistor CT via the via contact V1, the MTJ element, and the like. As shown in FIG. 6, the drain layer D of the cell transistor CT is connected to the second bit line BL2 via the MTJ element, the via contact V1, and the like. The two MTJ element and one cell transistor CT are thereby connected in series between the first bit line BL1 and the second bit line BL2. In other words, both ends of each cell transistor CT are connected to the first and second bit lines BL1 or BL2 via the MTJ elements, respectively.

In this way, one end of each MTJ element is electrically connected to the source layer S or the drain layer D of one cell transistor CT, and the other end of the MTJ element is connected to the first or second bit line BL1 or BL2. The first and second bit lines BL1 and BL2 are commonly connected to the same active area AA via the MTJ elements.

As shown in FIG. 4, in a cross-section in the row direction, the lower end of each MTJ element is connected to the contact plug CB having the same width (length) as that of the active area AA in the row direction. The drain layer D (or the source layer S) of the cell transistor CT is formed under and along the contact plug CB. The lower end of the MTJ element is thereby electrically connected to the drain layer D (or the source layer S) of the cell transistor CT.

While the source layer S and the drain layer D of each cell transistor CT are named as they are for the sake of convenience, the positional relation between the source layer S and the drain layer D is often reversed depending on the current flow direction. Furthermore, the gate electrode GC of each cell transistor CT can function as the word line WL per se. Alternatively, however, the word lines WL can be provided in a different layer from a layer in which the gate electrode GC is provided. In this case, the gate electrode GC is electrically connected to one of the word lines WL via a contact (not shown).

As shown in FIG. 3, the two MTJ elements connected to the first and second bit lines BL1 and BL2, respectively, and adjacent in a direction oblique with respect to the row and column directions share one cell transistor CT. These two adjacent MTJ elements are provided on both sides of one word line WL. Furthermore, in the first embodiment, the connection between one first bit line BL1 and one active area AA (the source layer S of one cell transistor CT) and that between one second bit line BL2 and one active area AA (the drain layer D of one cell transistor CT) are all established via the MTJ elements. Therefore, between the first and second bit lines BL1 and BL2, the two MTJ elements and one cell transistor CT are connected in series in order of MTJ, CT, and MTJ. A current during a data writing operation and a data reading operation flows between the first and second bit lines BL1 and BL2 via the two MTJ elements and one cell transistor CT.

Furthermore, both ends of each cell transistor CT are connected to the first and second bit lines BL1 and BL2 via the MTJ elements, respectively. The two word lines (WL1 and WL3, for example) on the both sides of one MTJ element (MTJ1, for example) connected to the first bit line BL1 are adjacent to the two MTJ elements (MTJ0 and MTJ3, for example) connected to the second bit line BL2, respectively. The cell transistors CT are provided between one MTJ element (MTJ1, for example) and the two MTJ elements (MTJ0 and MTJ3, for example), respectively. The current flowing to one selected MTJ element is thereby driven via the two cell transistors CT during the data writing operation and the data reading operation.

In the first embodiment, the first and second bit lines BL1 and BL2 are formed out of the same wiring layer. Therefore, the first and second bit lines BL1 and BL2 can be formed by one lithographic step and one etching step.

During the data reading operation or the data writing operation, when one first MTJ element connected to the first bit line BL1 is to be selected, a current flows to the first MTJ element via a plurality of second MTJ elements connected to the second bit line BL2. At this time, the one first MTJ element is a selected MTJ element to or from which data is read or written and the second MTJ elements are unselected MTJ element. For example, in FIG. 3, when a current is to selectively flow to the MTJ element M1, the two word lines WL1 and WL3 on the both sides of the MTJ element MTJ1 are driven. A current from the second bit line BL2 thereby flows to the active area AA via each of the two MTJ elements MTJ0 and MTJ3 obliquely adjacent to the MTJ element MTJ1, and then flows to the MTJ element MTJ1 via each of two cell transistors CT1 and CT3 connected to the MTJ elements MTJ0 and MTJ3, respectively. The current passing through the MTJ element MTJ1 then flows to the first bit line BL1.

On the other hand, when one second MTJ element connected to the second bit line BL2 is to be selected, a current flows to the second MTJ element via a plurality of first MTJ elements connected to the first bit line BL1. At this time, the one second MTJ element is a selected MTJ element to or from which data is read or written and the first MTJ elements are unselected MTJ elements. For example, in FIG. 3, when a current is to selectively flow to the MTJ element M0, the two word lines WL1 and WL2 on the both sides of the MTJ element MTJ0 are driven. A current from the first bit line BL1 thereby flows to the active area AA via each of the two MTJ elements MTJ1 and MTJ2 obliquely adjacent to the MTJ element MTJ0, and then flows to the MTJ element MTJ0 via each of two cell transistors CT1 and CT2 connected to the MTJ elements MTJ1 and MTJ2, respectively. The current passing through the MTJ element MTJ0 then flows to the second bit line BL2.

In the first embodiment, whichever MTJ element is selected, the current passing through the two unselected MTJ elements (hereinafter, also "pass MTJ elements") flows to one selected MTJ element. As the current flowing to each of the two unselected MTJ element is assumed as Imtj, a current 2×Imtj can be carried to the selected MTJ element.

Therefore, when the magnetization orientation of one MTJ element is not reversed when the current Imtj flows to the MTJ element but reversed when the current 2×Imtj flows to the MTJ element, it is possible to write data only to the selected MTJ element. Such an MTJ element can be realized by making an increase in a reversal probability according to a change in a passing current (that is, by raising an increase rate of the reversal probability) sharp. With this configuration, when the passing current is Imtj, the MTJ element is hardly disturbed. On the other hand, when the passing current is 2×Imtj, the magnetization orientation of the MTJ element can be sufficiently reversed. That is, data can be written only to the selected MTJ element. No data is written to the two pass MTJ elements through which the current passes.

During the data reading operation, only a current to the extent that the magnetization orientation of the selected MTJ element is not reversed flows to the selected MTJ element in the first place. Therefore, only the current as half as a read current for reading data from the selected MTJ element flows to each of the two pass MTJ elements adjacent to the selected MTJ element, and the pass MTJ elements are hardly disturbed.

However, it is necessary to take into account that the read current applied to the selected MTJ element changes according to data states (resistances) of the two pass MTJ elements. This is because a resistance Rtotal between the first and second lines BL1 and BL2 accounts for a combined of resistances between the selected MTJ element and the two pass MTJ elements, respectively.

Figures 7A, 7B:
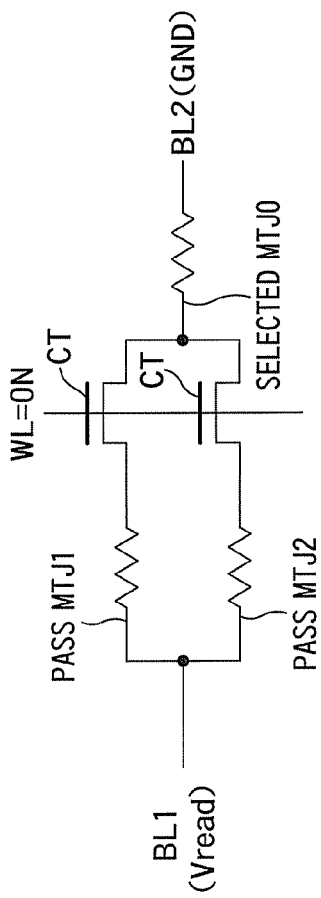
FIG. 7A is an equivalent circuit diagram between the first bit line BL1 and the second bit line BL2 during the data reading operation.
FIG. 7B is a table representing relations between the combination of the resistance of the selected MTJ element and those of the two pass MTJ elements and the resistance Rtotal between the first and second lines BL1 and BL2.

FIG. 7A is an equivalent circuit diagram between the first bit line BL1 and the second bit line BL2 during the data reading operation. FIG. 7B is a table representing relations between the combination of the resistance of the selected MTJ element and those of the two pass MTJ elements and the resistance Rtotal between the first and second lines BL1 and BL2.

As shown in FIG. 7A, the selected MTJ element MTJ0 and the pass MTJ elements MTJ1 and MTJ2 can be regarded as resistors during the data reading operation. The pass MTJ elements MTJ1 and MTJ2 are connected in parallel between the selected MTJ element MTJ0 and the first bit line BL1. Because the cell transistors CT are in a conductive state, resistances of the cell transistors CT are negligible with respect to those of the MTJ elements MTJ0 to MTJ2.

As shown in FIG. 7B, in the first embodiment, the resistance (read current) changes according to not only data stored in the selected MTJ element MTJ0 but also those stored in the pass MTJ elements MTJ1 and MTJ2. For example, it is assumed that the resistance of the MTJ element in the P state is 7 kiloohms (Kohms) and that of the MTJ element in the AP state is 21 Kohms.

In this case, when the selected MTJ element MTJ0 is in the P state (data "0"), the resistance Rtotal between the first bit line BL1 and the second bit line BL2 can change in a range from 10.5 Kohms to 17.5 Kohms according to the data states of the two pass MTJ elements MTJ1 and MTJ2. When the selected MTJ element MTJ0 is in the AP state (data "1"), the resistance Rtotal between the first bit line BL1 and the second bit line BL2 can change in a range from 24.5 Kohms to 31.5 Kohms according to the data states of the two pass MTJ elements MTJ1 and MTJ2.

A margin between the resistance Rtotal when the selected MTJ element MTJ0 stores data "0" and that when the selected MTJ element MTJ0 stores data "1" is 7 Kohms. Although this margin between the resistances Rtotal is smaller than a margin (14 Kohms) between the resistance between the selected MTJ element MTJ0 storing data "0" and that storing data "1", the former margin suffices for the data reading operation.

An area of a unit cell (a unit memory cell) UC (indicated by a broken line in FIG. 3) in the MRAM configured as described above is $8F^2$. The unit cell UC is a pattern that represents one unit of the plan layout. The plan layout of the memory cell array MCA is formed by repeating this pattern in a plane of the silicon substrate 10. Note that F (Feature Size) is a minimum feature size by the lithography and etching. The area of this unit cell UC is half as large as an area ($16F^2$) of the unit cell UC in the conventional MRAM.

The first and second bit lines BL1 and BL2 in the MRAM according to the first embodiment are both connected to the same active area AA via the MTJ elements. The connection between one first bit line BL1 and one active area AA and that between one second bit line BL2 and one active area AA are all established via the MTJ elements. That is, none of the first and second bit lines BL1 and BL2 is connected to the active area AA only via contacts such as the via contacts V1 or the contact plugs CB.

Therefore, in the first embodiment, it is possible to increase an array density of the MTJ elements in the plan layout. This can, in turn, reduce a layout area of the unit cells (unit memory cells) UC as compared with that in the conventional MRAM.

On the other hand, when a current is to flow to the selected MTJ element during the data writing, the current is supplied to the selected MTJ element via the pass MTJ elements adjacent to the selected MTJ element and the two cell transistors CT. Therefore, it is possible to supply a write current sufficiently higher than an inversion threshold current to the selected MTJ element.

As a result, in the first embodiment, the unit cell UC can be made small in a size as compared with that in the conventional MRAM, and it is possible to sufficiently secure a current driving capability of each cell transistor CT so as to be able to supply a sufficient current to the MTJ element.

Second Embodiment

Figure 8:
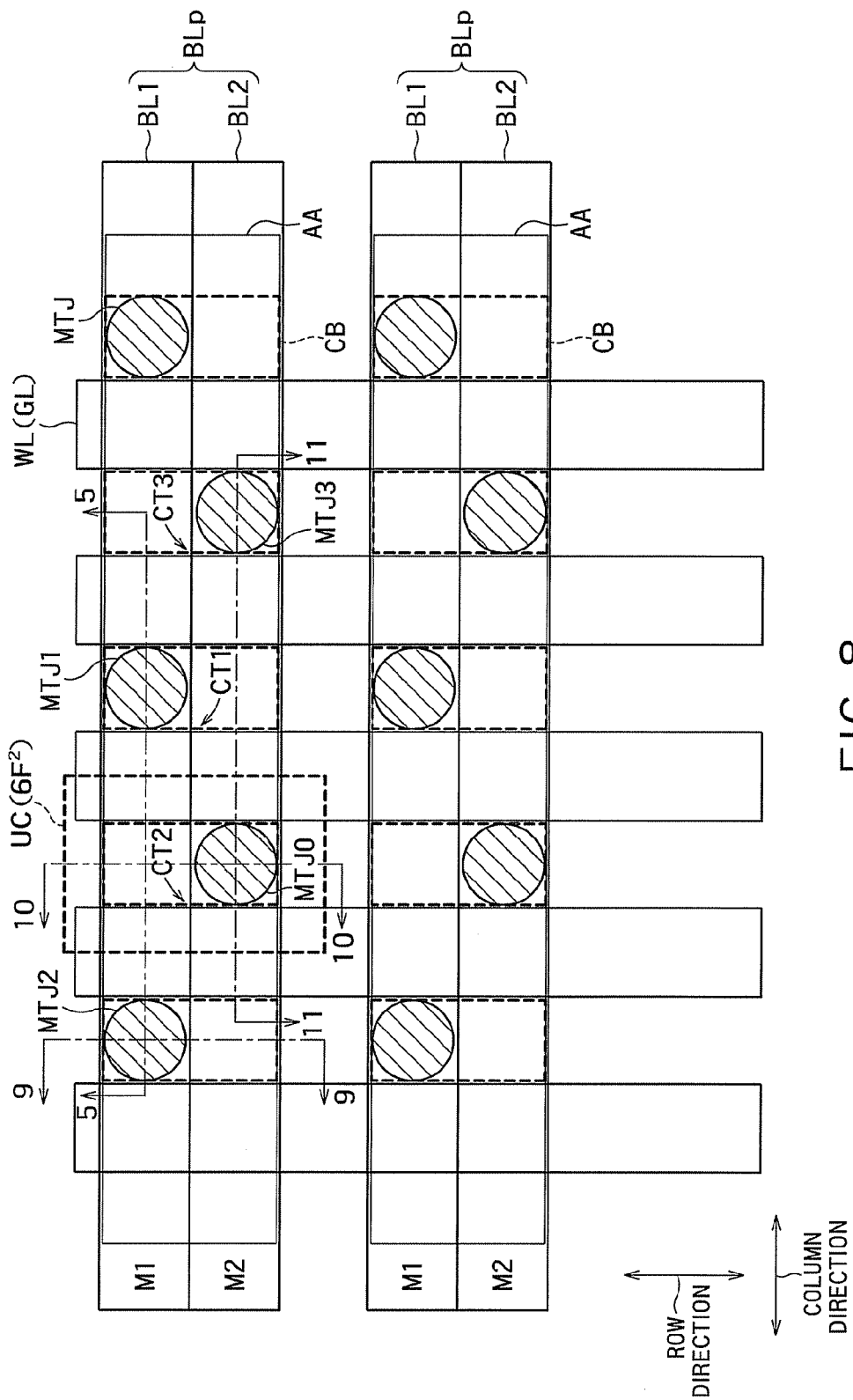
FIG. 8 is a partial plan layout of each memory cell array MCA in an MRAM according to a second embodiment.
Figure 9:
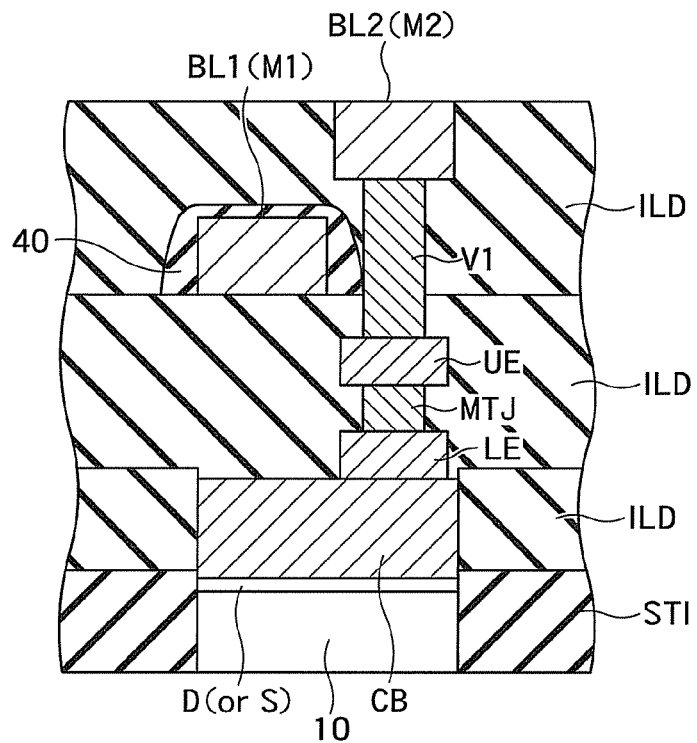
FIG. 9 is a cross-sectional view taken along a line 9-9 of FIG. 8.
Figure 10:
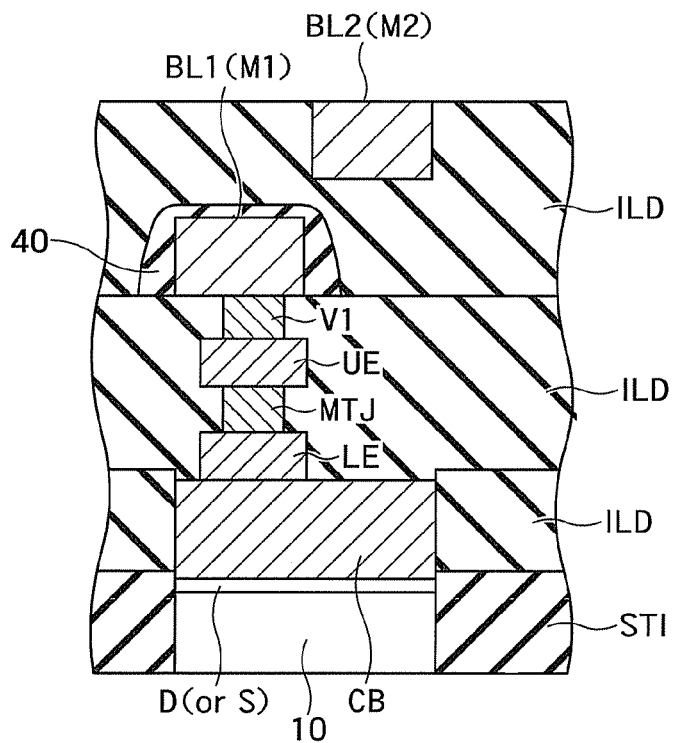
FIG. 10 is a cross-sectional view taken along a line 10-10 of FIG. 8.
Figure 11:
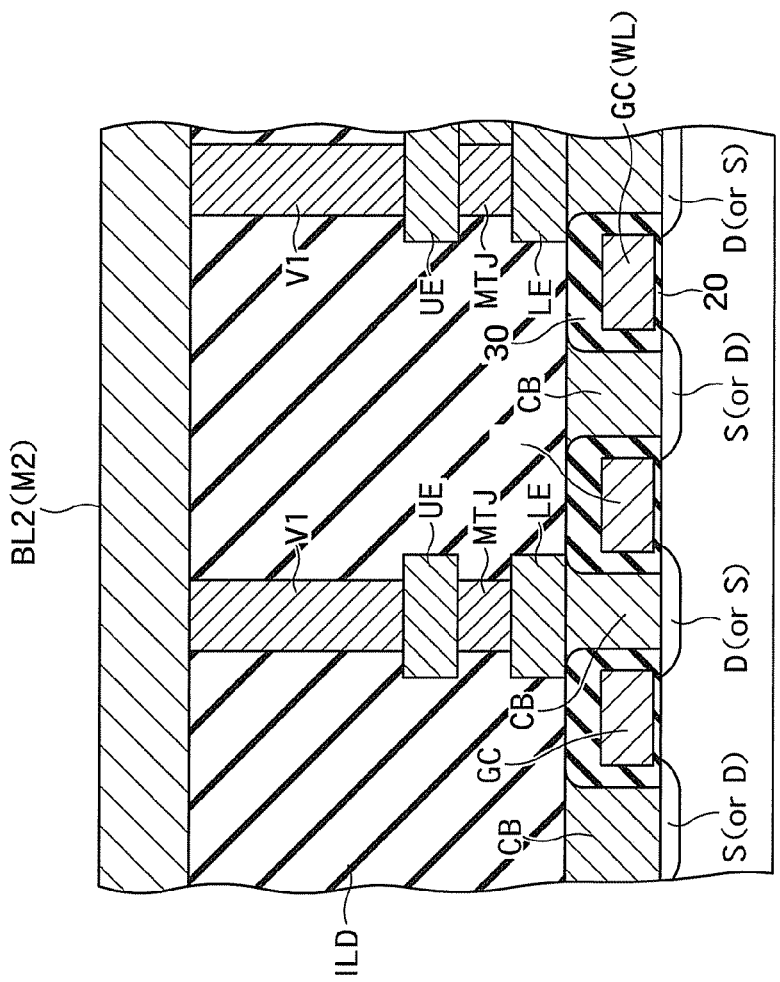
FIG. 11 is a cross-sectional view taken along a line 11-11 of FIG. 8.

FIG. 8 is a partial plan layout of each memory cell array MCA in an MRAM according to a second embodiment. FIG. 9 is a cross-sectional view taken along a line 9-9 of FIG. 8. FIG. 10 is a cross-sectional view taken along a line 10-10 of FIG. 8. FIG. 11 is a cross-sectional view taken along a line 11-11 of FIG. 8. Note that a cross-sectional view taken along a line 5-5 in FIG. 8 is the same as that shown in FIG. 5.

In the first embodiment, the first and second bit lines BL1 and BL2 are formed out of the same wiring layer. In the second embodiment, by contrast, the first and second bit lines BL1 and BL2 are formed out of different metal wiring layers M1 and M2, respectively, as shown in FIGS. 9 and 10. Furthermore, the first and second bit lines BL1 and BL2 are electrically connected to the source layer S or the drain layer D of each cell transistor CT via the MTJ element at different positions in the column direction, respectively. This can eliminate a space between the first and second bit lines BL1 and BL2 that constitute one bit line pair BLp while keeping the first and second bit lines BL1 and BL2 electrically isolated from each other.

As shown in FIG. 9, each second bit line BL2 is formed out of the metal wiring layer M2 upper than the metal wiring layer M1. Therefore, as shown in FIGS. 9 and 11, the second bit line BL2 is connected to the upper electrode UE via the deep via contact V1. As shown in FIG. 10, each first bit line BL1 is formed out of the metal wiring layer M1 lower than the metal wiring layer M2. Therefore, the first bit line BL1 is connected to the upper electrode UE via the relatively shallow via contact V1.

As shown in FIG. 9, no space is provided between the first and second bit lines BL1 and BL2 constituting the bit line pair BLp. Therefore, a protection insulating film 40 is provided to cover a side surface and an upper surface of each first bit line BL1 with the protection insulating film 40 so as to prevent short-circuits between the first or second bit line BL1 or BL2 and the via contacts V1 connected to the first and second bit lines BL1 and BL2, respectively. A contact hole can be thereby formed by the lithography and the etching using a photoresist and the protection insulating film 40 as a mask during the formation of the via contacts V1 connected to the second bit lines BL2. A material lower in an etching rate than a material of an interlayer dielectric film ILD is used to form the protection insulating film 40. When the interlayer dielectric film ILD is made of silicon oxide, for example, the protection insulating film 40 is made of silicon nitride. Other configurations of the second embodiment can be identical to corresponding ones of the first embodiment.

According to the second embodiment, the space between the first and second bit lines BL1 and BL2 can be eliminated in the plan layout as shown in FIG. 8. Therefore, it is possible to further reduce the area of the unit cell UC. The area of the unit cell UC shown in FIG. 8 is $6F^2$, for example.

Operations of the MRAM according to the second embodiment can be identical to those of the MRAM according to the first embodiment.

The first and second bit lines BL1 and BL2 in the MRAM according to the second embodiment are both connected to the same active area AA via the MTJ elements. The connection between one first bit line BL1 and one active area AA and that between one second bit line BL2 and one active area AA are all established via the MTJ elements. That is, none of the first and second bit lines BL1 and BL2 is connected to the active area AA only via contacts such as the via contacts V1 or the contact plugs CB. Furthermore, the data reading operation and the data writing operation according to the second embodiment are performed similarly to those according to the first embodiment.

Therefore, the second embodiment can also achieve effects identical to those of the first embodiment.

Furthermore, according to the second embodiment, because the space between the first and second bit lines BL1 and BL2 can be eliminated, the area of the unit cell UC can be made smaller than that according to the first embodiment.

As a result, in the second embodiment like the first embodiment, the unit cell UC can be made small in the size as compared with that in the conventional MRAM, and it is possible to sufficiently secure the current driving capability of each cell transistor CT so as to be able to supply a sufficient current to the MTJ element.

However, in the second embodiment, because the distance between the via contact V1 connected to the upper second bit line BL2 and the lower first bit line BL1 is small, it is necessary to add a step of forming the protection insulating film 40 on the upper and side surfaces of each first bit line BL1. It is also necessary to prepare the two different metal wiring layers M1 and M2 for the first and second bit lines BL1 and BL2, respectively.

Further, according to the second embodiment, because the space between the first and second bit lines BL1 and BL2 is eliminated in the plan layout, the gate width of each cell transistor CT is smaller than that of the cell transistor CT according to the first embodiment. Nevertheless, because the current is supplied to the selected MTJ element via the two cell transistors CT, by the MRAM according to the second embodiment, it is possible to supply the write current equal to or higher than the inversion threshold current to the selected MTJ element.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a semiconductor substrate;
an active area on the semiconductor substrate;
a plurality of cell transistors on the active area;
a pair of a first bit line and a second bit line which are adjacent to each other;
a plurality of word lines intersecting the first and second bit lines; and
a plurality of storage elements respectively having a first end electrically connected to a source or a drain of one of the cell transistors and a second end connected to the first or second bit line, wherein
both of the first and second bit lines are connected to the same active area via the storage elements, wherein
the cell transistors respectively have one end directly connected to the first bit line via one of the storage elements and the other end directly connected to the second bit line via one of the storage elements.

2. The device of claim 1, wherein
during a data reading operation or a data writing operation,
when one first storage element connected to the first bit line is selected from the storage elements, a current flows to the first storage element via a plurality of second storage elements, among the storage elements, connected to the second bit line, and
when one of the second storage elements connected to the second bit line is selected from the storage elements, a current flows to the one second storage element via a plurality of the first storage elements, among the storage elements, connected to the first bit line.

3. The device of claim 1, wherein a connection between the first bit line and the active area and a connection between the second bit line and the active area are all established via the storage elements.

4. The device of claim 2, wherein a connection between the first bit line and the active area and a connection between the second bit line and the active area are all established via the storage elements.

5. The device of claim 1, wherein
two word lines on both sides of one of the first storage elements connected to the first bit line is adjacent to two of the second storage elements connected to the second bit line, and
two of the cell transistors are provided between the one first storage element and the two second storage elements, respectively.

6. The device of claim 2, wherein
two word lines on both sides of one of the first storage elements connected to the first bit line is adjacent to two of the second storage elements connected to the second bit line, and
two of the cell transistors are provided between the one first storage element and the two second storage elements, respectively.

7. The device of claim 3, wherein
two word lines on both sides of one of the first storage elements connected to the first bit line is adjacent to two of the second storage elements connected to the second bit line, and two of the cell transistors are provided between the one first storage element and the two second storage elements, respectively.

8. The device of claim 1, wherein the storage elements commonly connected to the same active area are provided on both sides of each of the word lines.

9. The device of claim 2, wherein the storage elements commonly connected to the same active area are provided on both sides of each of the word lines.

10. The device of claim 1, wherein
one end of a first storage element among the storage elements is connected to the first bit line,
the other end of the first storage element is connected to one of a source and a drain of a first cell transistor among the cell transistors,
one end of a second storage element among the storage elements is connected to the source and the drain of the first cell transistor, and
the other end of the second storage element is connected to the second bit line.

11. The device of claim 2, wherein
one end of a first storage element among the storage elements is connected to the first bit line,
the other end of the first storage element is connected to one of a source and a drain of a first cell transistor among the cell transistors,
one end of a second storage element among the storage elements is connected to the source and the drain of the first cell transistor, and
the other end of the second storage element is connected to the second bit line.

12. The device of claim 3, wherein
one end of a first storage element among the storage elements is connected to the first bit line,
the other end of the first storage element is connected to one of a source and a drain of a first cell transistor among the cell transistors,
one end of a second storage element among the storage elements is connected to the source and the drain of the first cell transistor, and
the other end of the second storage element is connected to the second bit line.

13. The device of claim 1, wherein the first and second bit lines are formed out of a common wiring layer.

14. The device of claim 1, wherein the first and second bit lines are formed out of different wiring layers, respectively.

15. The device of claim 1, wherein the storage elements are magnetic tunnel junction elements.

16. The device of claim 1, wherein a connection between the first bit line and the source or the drain of one of the cell transistors and a connection between the second bit line and the source or the drain of the one cell transistor are established via the storage elements.

17. The device of claim 16, wherein a connection between the first bit line and the source or the drain of each of the cell transistors and a connection between the second bit line and the source or the drain of each of the cell transistors are all established via the storage elements.

* * * * *